United States Patent
Hwang et al.

(10) Patent No.: US 12,155,398 B2
(45) Date of Patent: Nov. 26, 2024

(54) SOFT DECISION-BASED LOW-COMPLEXITY DECODING METHOD AND COMPUTING DEVICE FOR PERFORMING THE METHOD

(71) Applicant: ELECTRONICS AND TELECOMMUNICATIONS RESEARCH INSTITUTE, Daejeon (KR)

(72) Inventors: In Ki Hwang, Daejeon (KR); Hun Sik Kang, Daejeon (KR); Joon Ki Lee, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 18/113,756

(22) Filed: Feb. 24, 2023

(65) Prior Publication Data
US 2024/0146330 A1     May 2, 2024

(30) Foreign Application Priority Data
Oct. 18, 2022     (KR) .................. 10-2022-0134359

(51) Int. Cl.
   *H03M 13/11*     (2006.01)
(52) U.S. Cl.
   CPC .................. *H03M 13/1111* (2013.01)
(58) Field of Classification Search
   CPC ................................. H03M 13/1111
   See application file for complete search history.

(56) References Cited

U.S. PATENT DOCUMENTS

| | | | |
|---|---|---|---|
| 8,201,047 B2 | 6/2012 | Sakai et al. | |
| 8,726,119 B2 | 5/2014 | Kang et al. | |
| 9,960,790 B2 | 5/2018 | Ismail et al. | |
| 11,223,448 B2 | 1/2022 | Park et al. | |
| 2013/0132791 A1* | 5/2013 | Alrod | H03M 13/1111 714/752 |
| 2016/0373136 A1* | 12/2016 | Ismail | H03M 13/611 |

FOREIGN PATENT DOCUMENTS

| | | |
|---|---|---|
| KR | 10-1198521 B1 | 11/2012 |
| KR | 10-2018-0125298 A | 11/2018 |
| WO | 2008/087042 A1 | 7/2008 |

OTHER PUBLICATIONS

Marvin Geiselhart et al., "Automorphism Ensemble Decoding of Quasi-Cyclic LDPC Codes by Breaking Graph Symmetries", arXiv:2022.00287v2 [cs.IT] Apr. 28, 2022.

* cited by examiner

*Primary Examiner* — Thien Nguyen
(74) *Attorney, Agent, or Firm* — LRK PATENT LAW FIRM

(57) ABSTRACT

Provided are a method of low-complexity decoding based on soft decision and a computing device for performing the method. The method of low-complexity decoding based on soft decision, performed by a computing device, includes receiving a vector, in which a codeword is modulated, through a channel, determining a decoding result by sequentially applying the received vector to one or more decoding algorithms, and decoding the codeword based on an analysis on the decoding result of a detector corresponding to each of the one or more decoding algorithms.

16 Claims, 7 Drawing Sheets

SOFT DECISION-BASED LOW-COMPLEXITY DECODING METHOD AND COMPUTING DEVICE FOR PERFORMING THE METHOD

CROSS-REFERENCE TO RELATED APPLICATION

This application claims the benefit of Korean Patent Application No. 10-2022-0134359 filed on Oct. 18, 2022, in the Korean Intellectual Property Office, the entire disclosure of which is incorporated herein by reference for all purposes.

BACKGROUND

1. Field of the Invention

One or more embodiments relate to a soft decision-based low-complexity decoding method, and more particularly, to a soft decision-based low-complexity decoding algorithm for a high-density parity-check code.

2. Description of Related Art

A Belief Propagation (BP) algorithm may be known as a representative decoding algorithm that achieves high performance when soft-decision information is given in a Low-Density Parity-Check (LDPC) code. However, such a BP algorithm may have an issue of degradation in the performance of error correction since various short cycles may be generated during a decoding process in a High Density Parity-Check (HDPC) that is a code having high density of a Parity-Check Matrix, similar to a Bose-Chaudhuri-Hocquenghem (BCH) code or a Reed-Solomon (RS) code.

To address such an issue of the performance degradation, in the prior art, a method has been studied that uses an automorphism group capable of transforming a Parity-Check Matrix by replacement while maintaining a code structure. More specifically, a random redundant decoding (RRD) algorithm has been developed which addresses the issue of the performance degradation caused by failure in the spread of information to all nodes due to the short cycle of HDPC since the RRD algorithm may correct an error by passing through a different Parity-Check Matrix for each decoding through an automorphism group.

In addition, in order to further improve performance, a modified RRD (mRRD) algorithm has been developed which selects a codeword closest to a received vector from among decoding results decoded through different replacements, to tackle a mis-decoding issue that decodes not a received codeword but a different one.

However, the existing mRRD algorithm may generate all of decoding result candidates to prevent mis-decoding and thus have an issue of increasing decoding complexity in proportion to the number of decoding result candidates to be generated.

SUMMARY

Embodiments provide a low-complexity decoding method based on soft decision and a semi-parallel Random Redundant Decoding (sRRD) algorithm that designs a detector capable of detecting whether mis-decoding occurs to solve the complexity issue of a modified Random Redundant Decoding (mRRD) algorithm.

According to an aspect, there is provided a method of low-complexity decoding based on soft decision, performed by a computing device, the method including receiving a vector, in which a codeword is modulated, through a channel, determining a decoding result by sequentially applying the received vector to one or more decoding algorithms, and decoding the codeword based on an analysis on the decoding result of a detector corresponding to each of the one or more decoding algorithms.

The detector may be configured to determine whether the decoding of the codeword succeeds based on a threshold value set by analyzing a statistical distribution of an inner product of the vector received through the channel and the decoding result of the decoding algorithm.

The detector may be configured to determine that the decoding of the codeword succeeds when the inner product of the vector received through the channel and the decoding result of the decoding algorithm exceeds the threshold value and determine that mis-decoding occurs when the inner product is less than the threshold value.

The determining of the decoding result may include generating a log likelihood ratio (LLR) vector by using the vector received through the channel, replacing the generated LLR vector with an arbitrary automorphism in an automorphism group of a code, and deriving a decoding result by applying, to a Belief Propagation (BP) algorithm, the LLR vector replaced with the arbitrary automorphism.

The determining of the decoding result may include inversely replacing the decoding result and transmitting the inversely-replaced decoding result when the decoding result derived through BP algorithm is the codeword or is decoded up to a maximum iteration count.

The determining of the decoding result may include re-selecting an arbitrary automorphism from the automorphism group, replacing the LLR vector with the reselected arbitrary automorphism, and then iterating a process of deriving the decoding result through the BP algorithm when the decoding result derived through the BP algorithm is not the codeword and does not reach a maximum iteration count.

The decoding of the codeword may include determining that the decoding of the codeword succeeds and terminating a decoding process when the decoding result determined through the decoding algorithm succeeds and no mis-decoding is detected through the detector.

The decoding of the codeword may include determining that the decoding of the codeword is a failure and storing a corresponding decoding result separately when the decoding result determined through the decoding algorithm is a failure or the decoding result succeeds but mis-decoding is detected through the detector.

The decoding of the codeword may include determining, to be a codeword, a decoding result closest to the received vector among stored decoding results, when the decoding result determined through all of the decoding algorithms is a failure or the mis-decoding is detected in a successful decoding result.

According to another aspect, there is provided computing device including a processor, a memory configured to load a program executed by the processor, and a storage configured to store the program. The program may include instructions to receive a vector, in which a codeword is modulated, through a channel, sequentially apply the received vector to one or more decoding algorithms to determine a decoding result, and decode the codeword based on an analysis on the decoding result of a detector corresponding to the one or more decoding algorithms.

The detector may be configured to determine whether the decoding of the codeword succeeds based on a threshold value set by analyzing a statistical distribution of an inner product of the vector received through the channel and the decoding result of the decoding algorithm.

The detector may be configured to determine that the decoding of the codeword succeeds when the inner product of the vector received through the channel and the decoding result of the decoding algorithm exceeds the threshold value and determine that mis-decoding occurs when the inner product is less than the threshold value.

The processor may be configured to generate a log likelihood ratio (LLR) vector by using the vector received through the channel, replace the generated LLR vector with an arbitrary automorphism in an automorphism group of a code, and derive a decoding result by applying, to a Belief Propagation (BP) algorithm, the LLR vector replaced with the arbitrary automorphism.

The processor may be configured to inversely replace the decoding result and transmit the inversely-replaced decoding result when the decoding result derived through BP algorithm is the codeword or is decoded up to a maximum iteration count.

The processor may be configured to re-select an arbitrary automorphism from the automorphism group, replace the LLR vector with the re-selected arbitrary automorphism, and then iterate a process of deriving the decoding result through the BP algorithm when the decoding result derived through the BP algorithm is not the codeword and does not reach a maximum iteration count.

The processor may be configured to determine that the decoding of the codeword succeeds and terminate a decoding process when the decoding result determined through the decoding algorithm succeeds and no mis-decoding is detected through the detector.

The processor may be configured to determine that the decoding of the codeword is a failure and store a corresponding decoding result separately when the decoding result determined through the decoding algorithm is a failure or the decoding result succeeds but mis-decoding is detected through the detector.

The processor may be configured to determine, to be a codeword, a decoding result closest to the received vector among stored decoding results, when the decoding result determined through all of the decoding algorithms is a failure or the mis-decoding is detected in a successful decoding result.

Additional aspects of embodiments will be set forth in part in the description which follows and, in part, will be apparent from the description, or may be learned by practice of the disclosure.

According to embodiments, the present disclosure may design a detector capable of detecting mis-decoding for early detection of mis-decoding on a received codeword such that the complexity issue of the mRRD algorithm may be resolved.

BRIEF DESCRIPTION OF THE DRAWINGS

These and/or other aspects, features, and advantages of the invention will become apparent and more readily appreciated from the following description of embodiments, taken in conjunction with the accompanying drawings of which.

DETAILED DESCRIPTION

Figure 1:
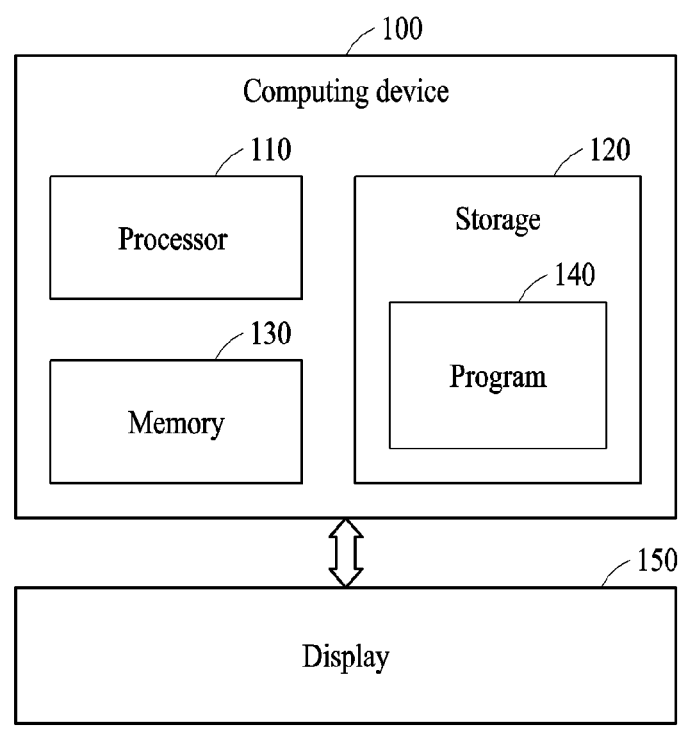
FIG. 1 is a diagram illustrating a configuration of a computing device according to an embodiment.

The following detailed structural or functional description is provided as an example only and various alterations and modifications may be made to the examples. Here, embodiments are not construed as limited to the disclosure and should be understood to include all changes, equivalents, and replacements within the idea and the technical scope of the disclosure.

Terms, such as first, second, and the like, may be used herein to describe various components. Each of these terminologies is not used to define an essence, order or sequence of a corresponding component but used merely to distinguish the corresponding component from other component(s). For example, a first component may be referred to as a second component, and similarly the second component may also be referred to as the first component.

It should be noted that if it is described that one component is "connected", "coupled", or "joined" to another component, a third component may be "connected", "coupled", and "joined" between the first and second components, although the first component may be directly connected, coupled, or joined to the second component.

The singular forms "a," "an," and "the" are intended to include the plural forms as well, unless the context clearly indicates otherwise. As used herein, "A or B", "at least one of A and B", "at least one of A or B", "A, B or C", "at least one of A, B and C", and "at least one of A, B, or C," each of which may include any one of the items listed together in the corresponding one of the phrases, or all possible combinations thereof. It will be further understood that the terms "comprises/including" and/or "includes/including" when used herein, specify the presence of stated features, integers, operations, operations, elements, and/or components, but do not preclude the presence or addition of one or more other features, integers, operations, operations, elements, components and/or groups thereof.

Unless otherwise defined, all terms, including technical and scientific terms, used herein have the same meaning as commonly understood by one of ordinary skill in the art to which this disclosure pertains. Terms, such as those defined in commonly used dictionaries, are to be interpreted as having a meaning that is consistent with their meaning in the context of the relevant art, and are not to be interpreted in an idealized or overly formal sense unless expressly so defined herein.

Hereinafter, embodiments will be described in detail with reference to the accompanying drawings. When describing the embodiments with reference to the accompanying drawings, like reference numerals refer to like constituent elements and a repeated description related thereto will be omitted.

FIG. 1 is a diagram illustrating a configuration of a computing device according to an embodiment.

As shown in FIG. 1, a computing device 100 may include one or more processors 110, a memory 130 configured to load a program 140 executed by the processor 110, and a storage 120 configured to store the program 140. Components included in the computing device 100 of FIG. 1 are only examples, and those skilled in the art to which the present disclosure pertains may further include other general-purpose components in addition to the components shown in FIG. 1.

The processor 110 may control the overall operation of each of the components in the computing device 100. The processor 110 may include at least one of a central processing unit (CPU), a microprocessor unit (MPU), a microcontroller unit (MCU), a graphics processing unit (GPU), and other well-known types of processors in a relevant field of technology. In addition, the processor 110 may perform an operation of at least one application or program to perform the methods/operations according to various embodiments. The computing device 100 may include one or more processors.

The memory 130 may store various sets of data, instructions, and/or information. The memory 130 may load the program 140 stored in the storage 120 to execute methods/operations according to various embodiments. An example of the memory 130 may be random-access memory (RAM) but is not limited thereto.

The storage 120 may non-temporarily store the one or more programs 140. The storage 120 may include a non-volatile memory such as read-only memory (ROM), erasable programmable ROM (EPROM), electrically EPROM (EEPROM) and flash memory; a hard disk drive (HDD); a solid state disk (SSD); a removable disk; or other well-known computer-readable types of recoding medium well known in the art to which the present disclosure pertains.

The program 140 may include one or more actions in which methods/operations are implemented according to various embodiments. Here, an operation may correspond to instructions implemented by the program 140. For example, the program 140 may include instructions to decode a codeword by receiving a vector in which a codeword is modulated through a channel, sequentially applying the received vector to one or more decoding algorithms to determine a decoding result, and decoding the codeword based on an analysis on the decoding result of a detector corresponding to the one or more decoding algorithms.

When the program 140 is loaded into the memory 130, the processor 110 may perform methods/operations according to various embodiments by executing a plurality of operations to implement the program 140.

An execution screen of the program 140 may be displayed on a display 150. In the case of FIG. 1, the display 150 may be represented as a separate device connecting to the computing device 100, but the computing device 100 of a user-portable terminal, such as a smartphone or a tablet, may include the display 150 as a component. A screen displayed by the display 150 may be a result before information is input to the program 140 or a result of executing the program 140.

Figure 2:
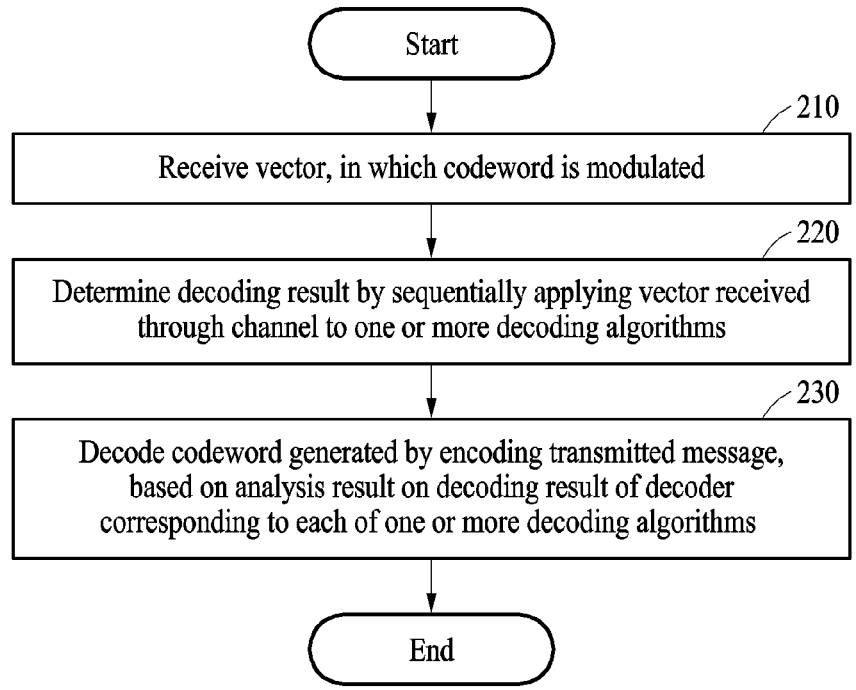
FIG. 2 is a flowchart illustrating a low-complexity decoding method according to an embodiment.

FIG. 2 is a flowchart illustrating a low-complexity decoding method according to an embodiment.

The low-complexity decoding method through a semi-parallel Random Redundant Decoding (sRRD) algorithm 200 shown in FIG. 2 may be performed by the processor 110 of the computing device 100. In this case, the computing device 100 may be included in a receiver of the present disclosure and may correspond to a decoder.

First, in operation 210, the processor 110 of the computing device 100 may receive a vector, in which a codeword is modulated, through a channel. For example, a codeword generated by encoding a transmitted message in a transmitter of the present disclosure may be defined as $c=(c_1, c_2, \ldots, c_N)$, and a vector value modulated by Binary Phase-Shift Keying (BPSK) to transmit the generated codeword through the channel may be defined as $x=(x_1, x_2, \ldots, x_N)$. In addition, when the modulated vector value is passed through an Additive White Gaussian Noise (AWGN) channel, assuming that the vector received by the receiver is $r=(r_1, r_2, \ldots, r_N)$, x and r may be expressed as in Equation 1 below.

$$x=2c-1, r=x+n \qquad \text{[Equation 1]}$$

In this case, $n=(n_1, n_2, \ldots, n_N)$ may denote a vector value by noise, and each vector value $n_i$ may follow a Gaussian distribution in which an average is 0 and a variance is $\sigma_2$. In addition, 1 may denote a vector in which all elements are 1.

In operation 220, the processor 110 may determine a decoding result by sequentially applying the vector received through the channel to one or more decoding algorithms. In this case, the decoding algorithms used to determine the decoding result may be an RRD algorithm, but the type of decoding algorithm is only one example and is not limited to the above example.

Figure 3:
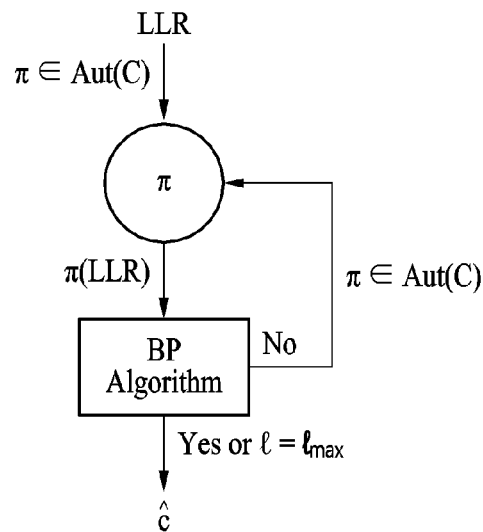
FIG. 3 is a diagram illustrating an operation method of an individual Random Redundant Decoding (RRD) algorithm included in a semi-parallel Random Redundant Decoding (sRRD) algorithm, according to an embodiment.

More specifically, the processor 110 may first apply the vector received through the channel to a decoding algorithm shown in FIG. 3 to determine a decoding result ĉ. To this end, the processor 110 may use the vector r received through the channel to generate a Log Likelihood Ratio (LLR) vector $L=(L_1, L_2, \ldots, L_N)$. In this case, the generated LLR vector L may be a vector to be input to a Belief Propagation (BP) algorithm, and an i-th element $L_i$ may be expressed as in Equation 2 below.

$$L_i = \log \frac{Pr(c_i = 1. \mid r)}{Pr(c_i = 0 \mid r)} \qquad <\text{Equation 2}>$$

That is, the i-th element $L_i$ may be a result obtained by taking a log value of a ratio between a probability that a decoding result $c_i$ is 0 when the vector r is received and a probability that a decoding result $c_i$ is 0 when the vector r is received.

The processor 110 may derive the decoding result ĉ by replacing the generated LLR vector L with an automorphism arbitrarily selected from an automorphism group of a code and then applying the replaced automorphism to the BP algorithm.

In an example, referring to FIG. 3, the processor 110 may generate the LLR vector L by using the vector r received through the channel and may replace the generated LLR vector L with π, which is arbitrarily selected from the automorphism group of the code and then apply the replaced π to the BP algorithm to thus derive the decoding result ĉ.

In this case, when the decoding result ĉ derived through the BP algorithm is a codeword generated by encoding a transmitted message or is decoded up to a maximum iteration count, the processor 110 may inversely replace the decoding result ĉ to be transferred to a detector corresponding to a decoding algorithm.

Reversely, when the decoding result ĉ derived through the BP algorithm is not a codeword generated by encoding the transmitted message and is decoded below the maximum iteration count, the processor 110 may re-derive the decoding result ĉ through the BP algorithm by arbitrarily re-selecting an automorphism from the automorphism group to replace the LLR vector L.

In operation 230, the processor 110 may decode the codeword generated by encoding the transmitted message, based on an analysis on the decoding result ĉ of the decoder corresponding to each of one or more decoding algorithms.

In this case, the detector may analyze the statistical distribution of an inner product of the vector r received through the channel and the decoding result ĉ of the decoding algorithm and thus determine whether the decoding of the codeword succeeds based on a set threshold value. More specifically, when the inner product of the vector r received through the channel and the decoding result ĉ of the decoding algorithm is greater than the threshold value, the detector may determine that the decoding of the codeword succeeds and when the inner product is less than or equal to the threshold value, the detector may determine that mis-decoding occurs.

When the decoding result ĉ determined through the decoding algorithm is successful and no mis-decoding is detected, the processor 110 may determine that the decoding of the codeword succeeds and terminate a decoding process.

However, when the decoding result ĉ determined through the decoding algorithm fails or the decoding result ĉ succeeds but mis-decoding is detected, the processor 110 may determine that the decoding of the codeword fails and store the decoding result separately.

Finally, when the decoding result ĉ determined with respect to all the decoding algorithms fails, or the detector detects mis-decoding in the successful decoding result ĉ, the processor 110 may determine, to be a codeword, a decoding result closest to the received vector r among decoding results separately stored. For example, the processor 110 may obtain a distance between the received vector r and each of separately stored decoding results in the form of sum(|c−r|).

The threshold value set by the detector may be determined as follows. First, the inner product y of a BPSK modulated vector x of the codeword generated by encoding the transmitted message and the received vector r may be expressed as in Equation 3 below, which may follow Gaussian distribution where an average is a code length N and a variance is $N\sigma^2$. In this case, the code length may refer to a result of adding the length of a message to be transmitted and the length of a parity generated by encoding.

$$y = \sum_{i=1}^{N}(x_i + n_i)x_i = N + \sum_{i=1}^{N}n_ix_i \sim \mathcal{N}(N, N\sigma^2) \quad <\text{Equation 3}>$$

It may be assumed that the BPSK modularized vector x' of the codeword determined to be mis-decoded may have a difference in values of elements included in the vector by as much as $d_{min}$, compared to the vector x. Here, $d_{min}$ may denote the minimum distance of codes and refer to a smallest value among distances (the number of different bits) between arbitrary two codewords. Since a position which has a difference between the elements of the vector x' and the elements of the vector x is a least reliable area due to a channel error, it may be assumed that element values of the vector r corresponding to the position is 0. In this case, the inner product of the vector x' and the vector r may be expressed as in Equation 4 below, which may follow a Gaussian distribution where an average is $N-d_{min}$ and a variance is $(N-d_{min})\sigma^2$.

$$y' = \sum_{i=1}^{N-d_{min}}(x_i + n_i)x_i \sim \mathcal{N}(N - d_{min}, (N - d_{min})\sigma^2) \quad <\text{Equation 4}>$$

Figure 4:
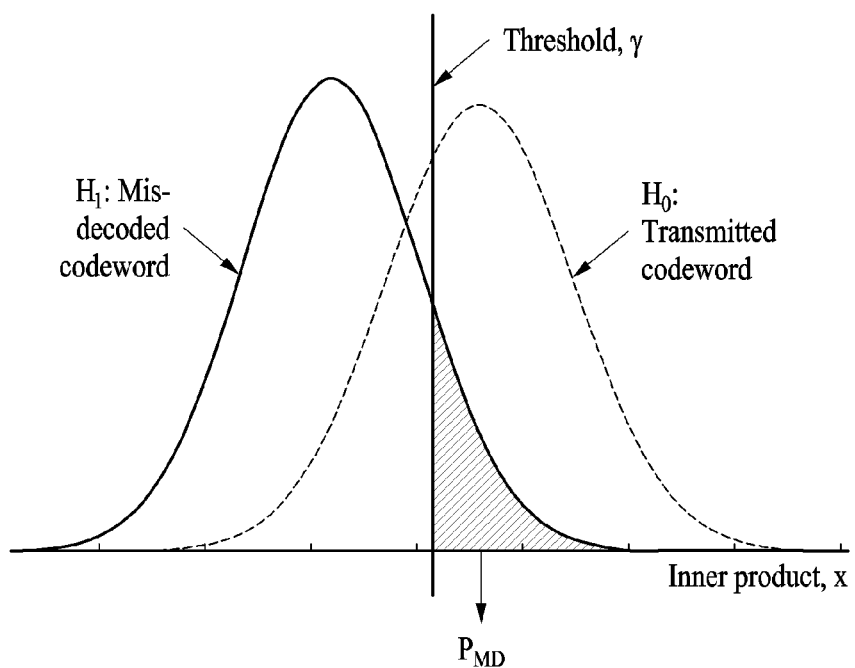
FIG. 4 is a diagram illustrating a statistical distribution according to an inner product of a transmitted codeword and a received vector and according to an inner product of a mis-decoded codeword and a received vector; and a possibility $P_{MD}$ of a failure in detecting mis-decoding when a threshold value determining mis-decoding is set at $\gamma$.

In this case, it may be assumed that the inner product value of the decoding result ĉ and the received vector r is ŷ. When a hypothesis that a transmitted message is accurately decoded into a codeword generated by encoding is $H_0$ and a hypothesis that mis-decoding occurs is $H_1$, the distribution followed by ŷ may be expressed as in Equation 5 below, which may be represented as the graph of FIG. 4.

$$\hat{y} \sim \begin{cases} \mathcal{N}(N, N\sigma^2) & \text{conditioned on } H_0 \\ \mathcal{N}(N - d_{min}, (N - d_{min})\sigma^2) & \text{conditioned on } H_1 \end{cases} \quad <\text{Equation 5}>$$

Here, $\mathcal{N}$ may denote a Gaussian distribution function. The detector may determine that a transmitted message is accurately decoded into a codeword generated by encoding when ŷ is greater than a certain threshold value γ and may determine that mis-decoding occurs when ŷ is less than the certain threshold value γ.

The process of obtaining the threshold value γ for the possibility $P_{MD}$ of failure in detection of mis-decoding to be the certain value α may be determined as in Equation 6 below.

$$P_{MD} = Q\left(\frac{\gamma - N + d_{min}}{\sqrt{(N - d_{min})}\sigma}\right) = \quad <\text{Equation 6}>$$

$$\alpha \leftrightarrow \gamma = Q^{-1}(\alpha)\sqrt{N - d_{min}}\,\sigma + N - d_{min}$$

Here, Q may denote a function that integrates the probability density function of a standard normal deviate, and a tail area of the function of the standard normal deviate may be obtained through the function.

Figure 5:
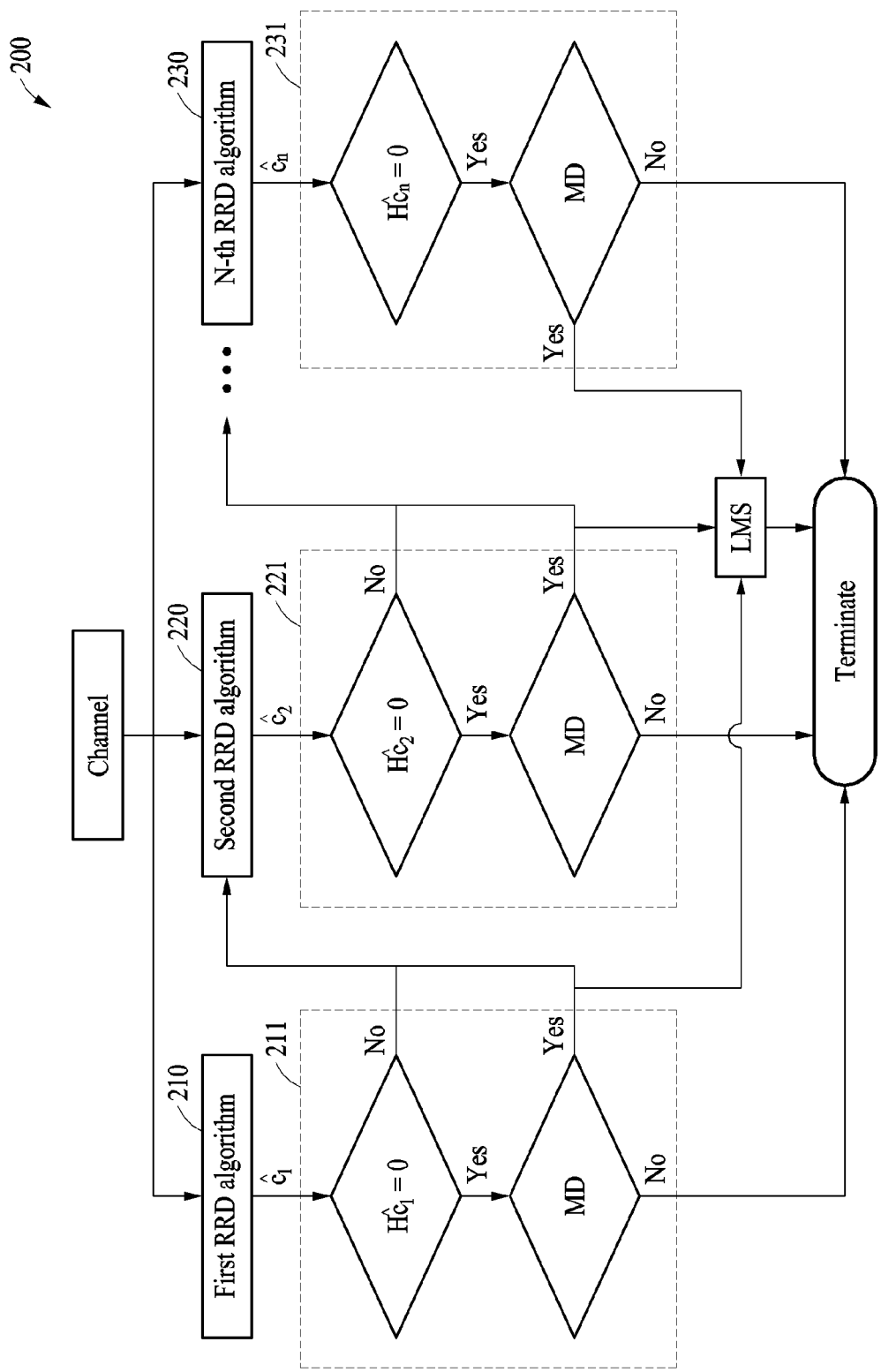
FIG. 5 is a diagram illustrating an operating method of an sRRD algorithm according to an embodiment.

FIG. 5 is a diagram illustrating an operating method of an sRRD algorithm according to an embodiment.

Referring to FIG. 5, an sRRD algorithm 200 operated by the processor 110 is shown. The processor 110 may apply a vector received through a channel to a first RRD algorithm 210 among RRD algorithms to thus determine a decoding result $ĉ_1$.

Thereafter, the processor 110 may determine whether the decoding with respect to the decoding result $ĉ_1$ succeeds through a detector 211. More specifically, when the processor 110 determines the decoding result $ĉ_1$ through the first RRD algorithm 210 to be successful and the detector 211 detects no mis-decoding, the processor 110 may determine decoding of the codeword to be successful and terminate the decoding process.

However, when the processor 110 determines the decoding result $\hat{c}_1$ through the first RRD algorithm 210 to be a failure or the detector 211 detects mis-decoding in the decoding result $\hat{c}_1$ determined to be successful, the processor 110 may separately store the decoding result $\hat{c}_1$.

Thereafter, the processor 110 may apply the vector received through the channel to a second RRD algorithm 220 among the RRD algorithms and may determine whether the decoding with respect to the decoding result $\hat{c}_2$ succeeds through the detector 221.

Similarly, when the processor 110 determines the decoding result $\hat{c}_2$ through the second RRD algorithm 220 to be successful and the detector 211 detects no mis-decoding, the processor 110 may determine the decoding of the codeword to be successful and terminate the decoding process.

However, when the processor 110 determines the decoding result $\hat{c}_2$ through the second RRD algorithm 220 to be a failure or the detector 211 detects mis-decoding in the decoding result $\hat{c}_2$ determined to be successful, the processor 110 may separately store the decoding result $\hat{c}_2$.

The processor 110 may repeatedly perform the decoding process above for n number of RRD algorithms included in the sRRD algorithm. In this case, when the decoding result $\hat{c}$ determined for all of the RRD algorithms is a failure or the detector 211 detects mis-decoding in the successful decoding result $\hat{c}$, the processor 110 may determine, to be a codeword, a decoding result closest to the received vector r among the separately stored decoding results.

That is, the sRRD algorithm provided by the present disclosure may have an advantage of reducing a decoding complexity since the sRRD algorithm may additionally design a detector for detecting mis-decoding for an existing mRRD algorithm such that the decoding may succeed with a small number of decoding results.

Figure 6:
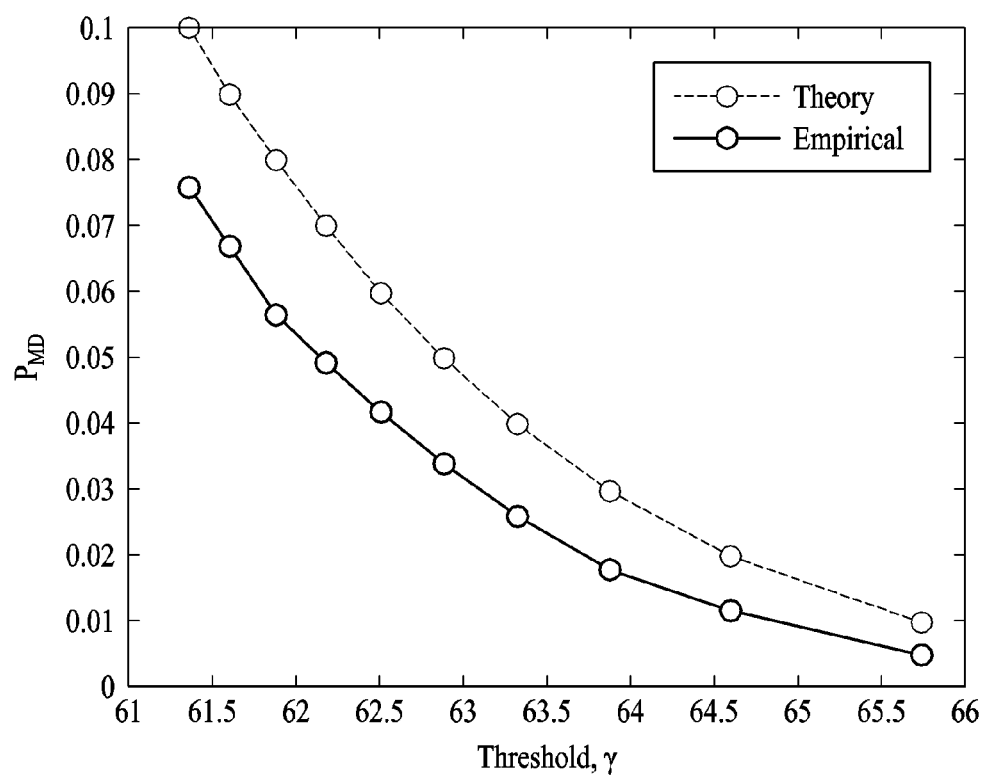
FIG. 6 is a diagram comparing an empirical value $P_{MD}$ of $P_{MD}$ to a theoretical result of $P_{MD}$ according to a threshold value $\gamma$ of a detector in a (63,45,3) BCH code, according to an embodiment.

FIG. 6 is a diagram comparing an empirical value $P_{MD}$ of $P_{MD}$ to a theoretical result of $P_{MD}$ according to a threshold value γ of a detector in a (63,45,3) BCH code, according to an embodiment.

Through the graph of FIG. 6, when $P_{MD}$, which is predicted theoretically with a threshold value determined in the (63,45,3) BCH code, is compared to $P_{MD}$, which is a value during the actual operation of a decoder, it may be confirmed that $P_{MD}$, which is the value during the actual operation of the decoder, is less than $P_{MD}$ predicted theoretically. That is, it may be seen that the theoretically obtained threshold value may guarantee a probability equal to or less than $P_{MD}$ that the theoretically obtained threshold value targets.

Figure 7A:
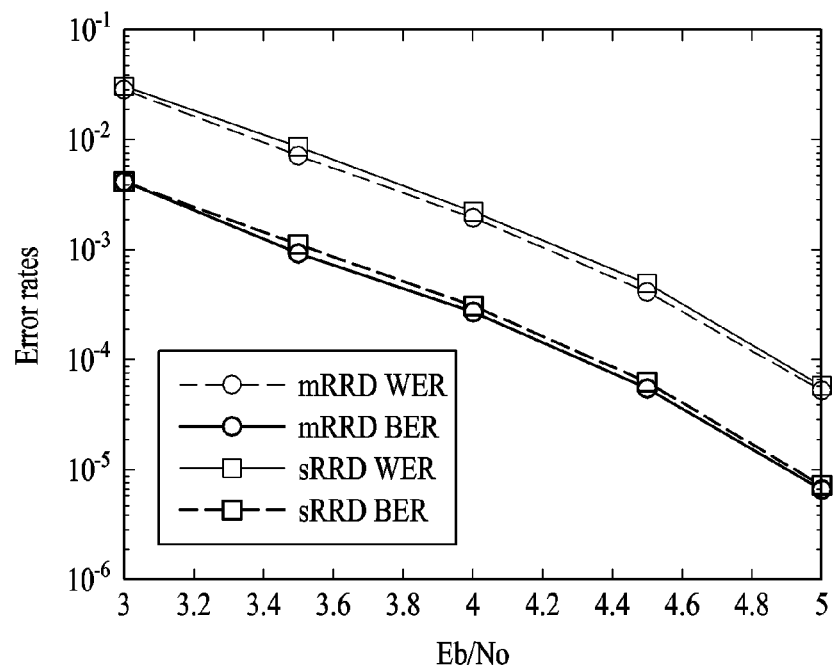
FIGS. 7A and 7B are diagrams comparing an existing modified RRD (mRRD) algorithm to an sRRD algorithm of the present disclosure in a (63,45,3) BCH code and a (511,493,2) BCH code in terms of performance of an error rate, respectively.
Figure 7B:
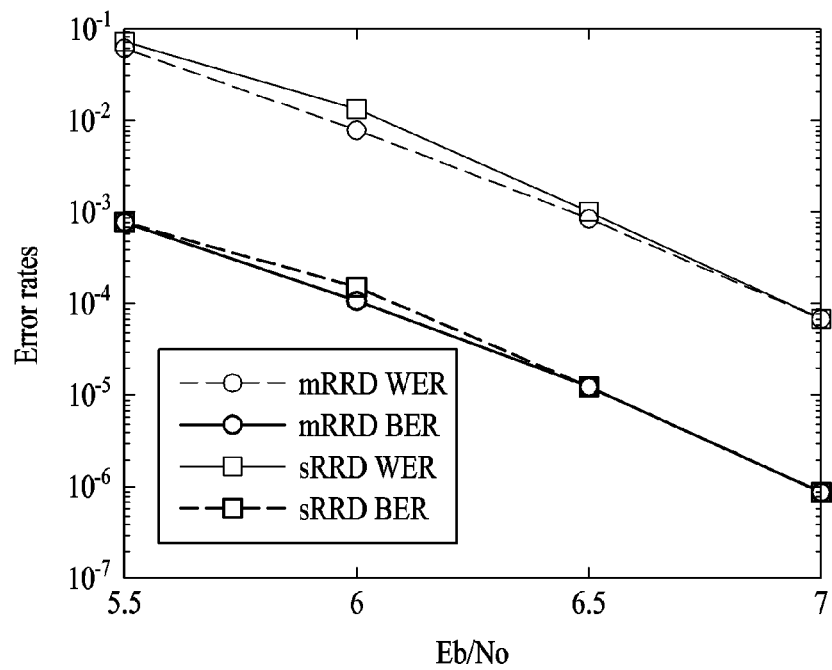

FIGS. 7A and 7B are diagrams comparing an existing mRRD algorithm to an sRRD algorithm of the present disclosure in a (63,45,3) BCH code and a (511,493,2) BCH code in terms of performance of an error rate.

FIG. 7A and FIG. 7B may show the performance of an error rate of an existing mRRD algorithm and an sRRD algorithm of the present disclosure when it is set that the maximum iteration count of a BP decoder is 1, the maximum iteration count of the RRD algorithm is 50, and the total number of decoding candidates generated is 20, in each of a (63,45,3) BCH code and a (511,493,2) BCH code. Referring to FIG. 7A and FIG. 7B, it may be seen that the detector of the sRRD algorithm may identify mis-decoding as accurately as the mRRD algorithm predicts an accurate codeword among the selected 20 candidates.

Figure 8A:
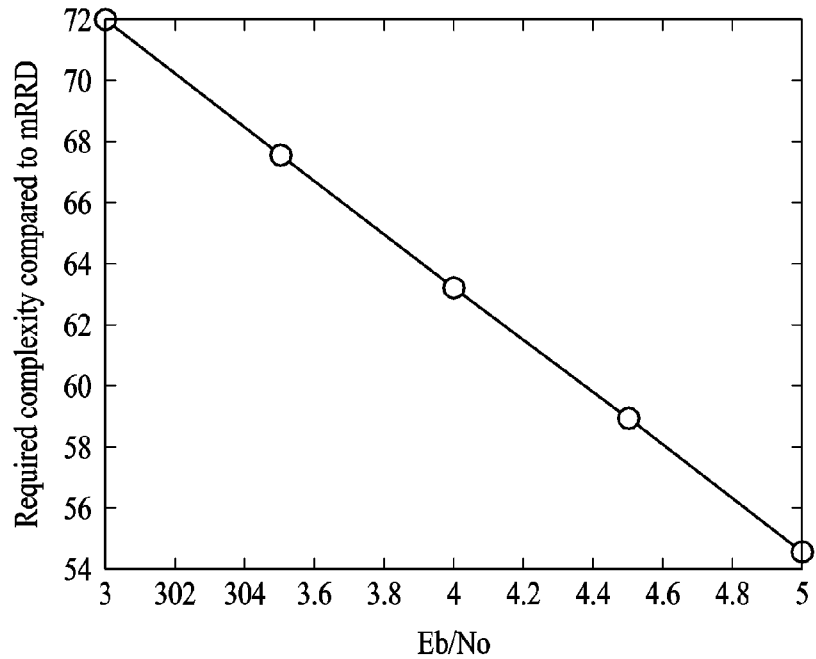
FIGS. 8A and 8B are diagrams quantifying improved computational complexity of an sRRD algorithm of the present disclosure compared to an existing mRRD algorithm in a (63,45,3) BCH code and a (511,493,2) BCH code, according to an embodiment.
Figure 8B:
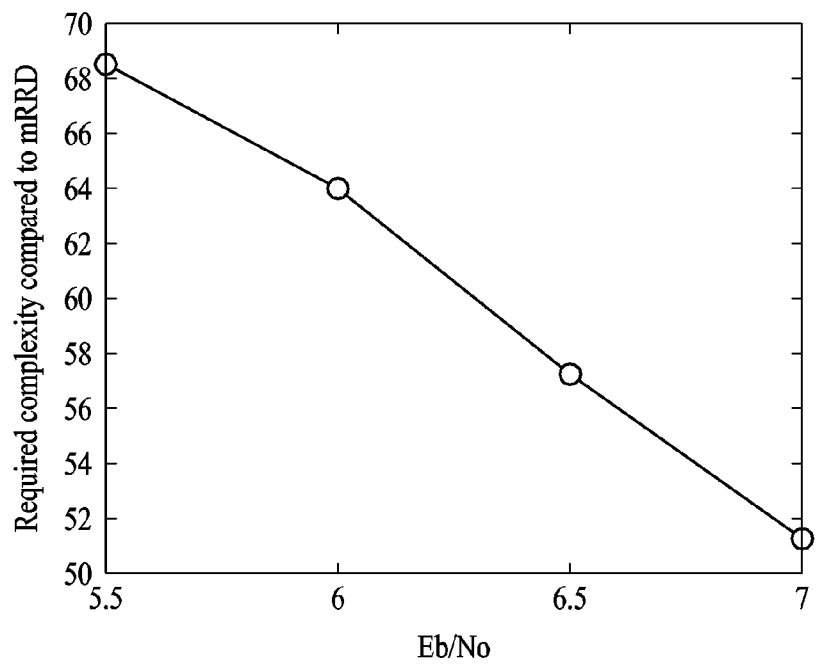

FIGS. 8A and 8B are diagrams quantifying improved computational complexity of an sRRD algorithm of the present disclosure compared to an existing mRRD algorithm in a (63,45,3) BCH code and a (511,493,2) BCH code, according to an embodiment.

FIGS. 8A and 8B may show the degree of improvement in computational complexity of the sRRD algorithm compared to the existing mRRD algorithm in the (63,45,3) BCH code and the (511,493,2) BCH code, respectively. Referring to FIGS. 8A and 8B, as a signal-to-noise ratio increases, the detector of the sRRD algorithm may quickly identify an accurate codeword, so that the degree of improvement in computational complexity may also increase.

The components described in the embodiments may be implemented by hardware components including, for example, at least one digital signal processor (DSP), a processor, a controller, an application-specific integrated circuit (ASIC), a programmable logic element, such as a field programmable gate array (FPGA), other electronic devices, or combinations thereof. At least some of the functions or the processes described in the embodiments may be implemented by software, and the software may be recorded on a recording medium. The components, the functions, and the processes described in the embodiments may be implemented by a combination of hardware and software.

The embodiments described herein may be implemented using a hardware component, a software component and/or a combination thereof. A processing device may be implemented using one or more general-purpose or special-purpose computers, such as, for example, a processor, a controller and an arithmetic logic unit (ALU), a digital signal processor (DSP), a microcomputer, an FPGA, a programmable logic unit (PLU), a microprocessor or any other device capable of responding to and executing instructions in a defined manner. The processing device may run an operating system (OS) and one or more software applications that run on the OS. The processing device also may access, store, manipulate, process, and create data in response to execution of the software. For purpose of simplicity, the description of a processing device is used as singular; however, one skilled in the art will appreciate that a processing device may include multiple processing elements and multiple types of processing elements. For example, the processing device may include a plurality of processors, or a single processor and a single controller. In addition, different processing configurations are possible, such as parallel processors.

The software may include a computer program, a piece of code, an instruction, or some combination thereof, to independently or uniformly instruct or configure the processing device to operate as desired. Software and data may be embodied permanently or temporarily in any type of machine, component, physical or virtual equipment, computer storage medium or device, or in a propagated signal wave capable of providing instructions or data to or being interpreted by the processing device. The software also may be distributed over network-coupled computer systems so that the software is stored and executed in a distributed fashion. The software and data may be stored by one or more non-transitory computer-readable recording mediums.

The methods according to the above-described embodiments may be recorded in non-transitory computer-readable media including program instructions to implement various operations of the above-described embodiments. The media may also include, alone or in combination with the program instructions, data files, data structures, and the like. The program instructions recorded on the media may be those specially designed and constructed for the purposes of examples, or they may be of the kind well-known and available to those having skill in the computer software arts. Examples of non-transitory computer-readable media include magnetic media such as hard disks, floppy disks, and magnetic tape; optical media such as CD-ROM discs, DVDs, and/or Blue-ray discs; magneto-optical media such as optical discs; and hardware devices that are specially configured to store and perform program instructions, such as ROM, random access memory (RAM), flash memory (e.g., USB flash drives, memory cards, memory sticks, etc.), and the like. Examples of program instructions include both machine code, such as produced by a compiler, and files containing higher-level code that may be executed by the computer using an interpreter.

The above-described devices may be configured to act as one or more software modules in order to perform the operations of the above-described embodiments, or vice versa.

As described above, although the embodiments have been described with reference to the limited drawings, a person skilled in the art may apply various technical modifications and variations based thereon. For example, suitable results may be achieved if the described techniques are performed in a different order and/or if components in a described system, architecture, device, or circuit are combined in a different manner and/or replaced or supplemented by other components or their equivalents.

Accordingly, other implementations are within the scope of the following claims.

What is claimed is:

1. A method of low-complexity decoding based on soft decision, performed by a computing device with a receiver, the method comprising:
    receiving a vector by the receiver from a transmitter of a different device, wherein the vector comprises an encoded codeword which has been modulated over a communication channel;
    determining a decoding result by sequentially applying the received vector to one or more decoding algorithms; and
    decoding the codeword based on an analysis on the decoding result of a detector corresponding to each of the one or more decoding algorithms,
    wherein the detector determines whether the decoding of the codeword succeeds based on a calculated threshold value determined by analyzing a statistical distribution of an inner product of the received vector and the decoding result of the decoding algorithm,
    wherein the calculated threshold value for a possibility of failure in detection of mis-decoding to be a certain value is determined by: a function that integrates the probability density function of a standard normal deviate, a code length N, a minimum distance of codes and a variance.

2. The method of claim 1, wherein the detector determines that the decoding of the codeword succeeds when the inner product of the received vector and the decoding result of the decoding algorithm exceeds the calculated threshold value and determine that mis-decoding occurs when the inner product is less than the calculated threshold value.

3. The method of claim 1, wherein the determining of the decoding result comprises:
    generating a log likelihood ratio (LLR) vector by using the received vector;
    replacing the generated LLR vector with an arbitrary automorphism in an automorphism group of a code wherein the automorphism group is a set of permutations of the codeword symbols that map the code onto itself; and
    deriving a decoding result by applying, to a Belief Propagation (BP) algorithm, the LLR vector replaced with the arbitrary automorphism.

4. The method of claim 3, wherein the determining of the decoding result comprises inversely replacing the decoding result and transmitting the inversely-replaced decoding result when the decoding result derived through BP algorithm is the codeword or is decoded up to a maximum iteration count.

5. The method of claim 3, wherein the determining of the decoding result comprises re-selecting an arbitrary automorphism from the automorphism group, replacing the LLR vector with the re-selected arbitrary automorphism, and then iterating a process of deriving the decoding result through the BP algorithm when the decoding result derived through the BP algorithm is not the codeword and does not reach a maximum iteration count.

6. The method of claim 1, wherein the decoding of the codeword comprises determining that the decoding of the codeword succeeds and terminating a decoding process when the decoding result determined through the decoding algorithm succeeds and no mis-decoding is detected through the detector.

7. The method of claim 1, wherein the decoding of the codeword comprises determining that the decoding of the codeword is a failure and storing a corresponding decoding result separately when the decoding result determined through the decoding algorithm is a failure or the decoding result succeeds but mis-decoding is detected through the detector.

8. The method of claim 7, wherein the decoding of the codeword comprises determining a decoding result closest to the received vector among a plurality of stored decoding results as the codeword, when the decoding result determined through all of the decoding algorithms is a failure or the mis-decoding is detected in a successful decoding result.

9. A computing device comprising:
    a processor;
    a receiver for receiving a vector from a transmitter of another device, wherein the vector comprises an encoded codeword which has been modulated over a communication channel;
    a memory configured to load a program executed by the processor; and
    a storage configured to store the program,
    wherein the program comprises instructions to sequentially apply the received vector to one or more decoding algorithms to determine a decoding result, and decode the codeword based on an analysis on the decoding result of a detector corresponding to the one or more decoding algorithms,
    wherein the detector determines whether the decoding of the codeword succeeds based on a calculated threshold value determined by analyzing a statistical distribution of an inner product of the received vector and the decoding result of the decoding algorithm,
    wherein the calculated threshold value for a possibility of failure in detection of mis-decoding to be a certain value is determined by: a function that integrates the probability density function of a standard normal deviate, a code length N, a minimum distance of codes and a variance.

10. The computing device of claim 9, wherein the detector determines that the decoding of the codeword succeeds when the inner product of the received vector and the decoding result of the decoding algorithm exceeds the calculated threshold value and determine that mis-decoding occurs when the inner product is less than the calculated threshold value.

11. The computing device of claim 9, wherein the processor generates a log likelihood ratio (LLR) vector by using the received vector, replaces the generated LLR vector with an arbitrary automorphism in an automorphism group of a code wherein the automorphism group is a set of permutations of the codeword symbols that map the code onto itself, and derives a decoding result by applying, to a Belief Propagation (BP) algorithm, the LLR vector replaced with the arbitrary automorphism.

12. The computing device of claim 11, wherein the processor inversely replaces the decoding result and transmit the inversely-replaced decoding result when the decoding result derived through BP algorithm is the codeword or is decoded up to a maximum iteration count.

13. The computing device of claim 11, wherein the processor re-selects an arbitrary automorphism from the automorphism group, replaces the LLR vector with the re-selected arbitrary automorphism, and then iterates a process of deriving the decoding result through the BP algorithm when the decoding result derived through the BP algorithm is not the codeword and does not reach a maximum iteration count.

14. The computing device of claim 9, wherein the processor determines that the decoding of the codeword succeeds and terminates a decoding process when the decoding result determined through the decoding algorithm succeeds and no mis-decoding is detected through the detector.

15. The computing device of claim 9, wherein the processor determines that the decoding of the codeword is a failure and stores a corresponding decoding result separately when the decoding result determined through the decoding algorithm is a failure or the decoding result succeeds but mis-decoding is detected through the detector.

16. The computing device of claim 15, wherein the processor determines a decoding result closest to the received vector among a plurality of stored decoding results as the codeword, when the decoding result determined through all of the decoding algorithms is a failure or the mis-decoding is detected in a successful decoding result.

* * * * *